US012632118B2

(12) United States Patent (10) Patent No.: US 12,632,118 B2

Jeon (45) Date of Patent: May 19, 2026

(54) MOTION GESTURE SENSING DEVICE AND VEHICLE-MOUNTED UNIT MANIPULATION SYSTEM HAVING SAME

(71) Applicant: SEOYON E-HWA CO., LTD., Anyang (KR)

(72) Inventor: Jong Hwan Jeon, Anyang (KR)

(73) Assignee: SEOYON E-HWA CO., LTD., Anyang (KR)

( * ) Notice: Subject to any disclaimer, the term of this patent is extended or adjusted under 35 U.S.C. 154(b) by 926 days.

(21) Appl. No.: 17/750,316

(22) Filed: May 21, 2022

(65) Prior Publication Data

US 2023/0136017 A1 May 4, 2023

(30) Foreign Application Priority Data

Oct. 29, 2021 (KR) ........................ 10-2021-0146613

(51) Int. Cl.
| | |
|---|---|
| *G06F 3/08* | (2006.01) |
| *B60J 7/00* | (2006.01) |
| *B60Q 1/00* | (2006.01) |
| *G01R 33/02* | (2006.01) |
| *G06F 3/01* | (2006.01) |

(52) U.S. Cl.
CPC ................ *G06F 3/017* (2013.01); *B60J 7/00* (2013.01); *B60Q 1/0023* (2013.01); *G01R 33/02* (2013.01)

(58) Field of Classification Search
CPC .......... G06F 3/017; B60J 7/00; B60Q 1/0023;

B60Q 3/74; B60Q 3/82; G01R 33/02; G06V 20/597; G06V 40/11; B60W 40/08; B60W 50/0098; B60W 50/08; B60W 2540/223

See application file for complete search history.

(56) References Cited

U.S. PATENT DOCUMENTS

| | | | |
|---|---|---|---|
| 2011/0042196 A1* | 2/2011 | Yokoyama ........... | H01H 13/705 |
| | | | 200/600 |
| 2012/0299577 A1* | 11/2012 | Aoyama ............ | B23K 11/0053 |
| | | | 324/76.11 |
| 2019/0227669 A1* | 7/2019 | Maharyta .............. | G06F 3/0448 |
| 2022/0035477 A1* | 2/2022 | Holmgren .............. | B60K 35/10 |
| 2023/0160763 A1* | 5/2023 | Kun ........................ | G01L 1/205 |
| | | | 200/341 |

FOREIGN PATENT DOCUMENTS

| | | | | |
|---|---|---|---|---|
| CN | 211507472 U | 9/2020 | | |
| CN | 108068731 B | 10/2022 | | |
| EP | 3321134 A1 | 5/2018 | | |
| KR | 10-2018-0078997 A | 7/2018 | | |
| KR | 20180078997 A | * 7/2018 | ............ | G06F 3/017 |
| KR | 1020180082068 A | 7/2018 | | |
| KR | 20200002198 A | 1/2020 | | |

* cited by examiner

*Primary Examiner* — Mohamed Abou El Seoud

(74) *Attorney, Agent, or Firm* — Harvest IP Law, LLP

(57) ABSTRACT

A motion gesture sensing device and a vehicle-mounted unit manipulation system to which the motion gesture sensing device is applied are proposed, in which a sensing space is formed with an electric field and a change in the electric field according to a motion gesture of an occupant in the sensing space is recognized so as to operate respective functions of vehicle-mounted units.

15 Claims, 17 Drawing Sheets

<u>100</u>

<u>200a</u>

E-FIELD

210b

250

270

230

210b

MOTION GESTURE SENSING DEVICE AND VEHICLE-MOUNTED UNIT MANIPULATION SYSTEM HAVING SAME

CROSS REFERENCE TO RELATED APPLICATION

The present application claims priority to Korean Patent Application No. 10-2021-0146613, filed on Oct. 29, 2021, the entire contents of which is incorporated herein for all purposes by this reference.

BACKGROUND OF THE INVENTION

Field of the Invention

The present disclosure relates to a motion gesture sensing device and a vehicle-mounted unit manipulation system having the same. More specifically, the present disclosure relates to a technology in which a sensing space is formed with an electric field and a change in the electric field according to a motion gesture of an occupant in the sensing space is recognized so as to operate respective functions of vehicle-mounted units.

Description of the Related Art

Various switches for operating vehicle-mounted units, such as driving-related units or convenience units, may be provided in a vehicle.

While push button switches that allow mechanical activation have been conventionally applied to operate respective vehicle-mounted units, touch sensitive electronic switches have been currently applied with the advancement of technology.

Such switches have a problem of increased risk of a vehicle accident by distracting a driver from looking ahead while driving the vehicle because the driver needs to turn his/her head to view the switches in order to operate the corresponding switches.

In particular, more and more units are being mounted on vehicles to improve vehicle quality and convenience, and as the number of these units increases, the number of corresponding switches also increases. This results in distraction of the driver's attention from the task of driving because the driver needs to find a particular switch, among many switches, in order to operate a specific vehicle-mounted unit.

In order to solve the problem caused by the operation of the vehicle switches, a technology for recognizing the operation of switches based only on proximity sensing without directly controlling the switches has been proposed.

As an example of the proximity sensing technologies, an optical sensing configuration or a capacitive sensing configuration has been proposed. Since this proximity sensing can only recognize a close proximity near a vehicle-mounted unit, a proximity sensor must be installed into each vehicle-mounted unit.

Also, a sensing configuration for recognizing a user's motion gesture has been proposed. As one of the motion gesture sensing configurations, there is a sensing device for recognizing a change in an electric field.

A sensing configuration for recognizing the change in the electric field provides a specified volume of sensing space formed of the electric field on the front side, and configured to detect the change in the electric field according to the user's motion in the sensing space and recognize this change as a switching operation.

As another motion gesture sensing configuration, there is a sensing device using a captured image. The sensing device using the captured image configured to analyze the captured image while continuously capturing the user's appearance with a camera to determine whether the user's motion is a specific gesture.

However, in the case of the conventional motion gesture sensing, an appropriate sensing space cannot be formed due to their technical configuration or various factors, and thus the recognition of the user's motion gesture is not reliable.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present disclosure has been made keeping in mind the above problems occurring in the related art, and an objective of the present disclosure is to provide a technology in which a sensing space is formed with an electric field and a change in the electric field according to a motion gesture of an occupant in the sensing space is recognized so as to operate respective functions of vehicle-mounted units.

In particular, the present disclosure is intended to solve the problem of increased risk of a vehicle accident caused by a vehicle driver failing to look ahead while driving the vehicle by turning his/her head toward switches to operate the switches.

Furthermore, the present disclosure is intended to solve the problem of the complexity of control interfaces and disfigured interior of the vehicle caused by the provision of the respective switches to various vehicle-mounted units.

Furthermore, the present disclosure is intended to solve the problem of the conventional motion gesture sensing configuration in which an appropriate sensing space cannot be formed due to various factors, which results in unstable performance of the recognition of the user's motion gesture.

The objective of the present disclosure is not limited to the above-mentioned objectives, and other objectives and advantages of the present disclosure not mentioned can be understood by the following description.

In order to achieve the above objectives, according to one aspect of the present invention, there is provided a motion gesture sensing device including: a sensing board including an electrode pattern forming a sensing space with an electric field on a front side of the electrode pattern and detecting a change in the electric field in response to a motion of a user in the sensing space; a gesture determination board determining a gesture of the user on the basis of the change in the electric field detected in the sensing space; and a main board supporting an execution of a specific function of a unit corresponding to the determined gesture.

Preferably, the sensing board may include: a transmitter electrode forming the electric field on the front side thereof to form the sensing space; and a receiver electrode detecting the change in the electric field according to the motion of the user in the sensing space.

As an example, the transmitter electrode may be formed in a central region of the sensing board, and the receiver electrodes may be formed in upper, lower, left, and right outer edges of the sensing board, respectively.

As another example, the transmitter electrode may include a plurality of electrodes spaced apart from each other on the central region to have different outputs.

Furthermore, the motion gesture sensing device may further include a cover disposed on the front side of the sensing board to cover the electrode pattern.

As an example, the cover may have a curved shape, and a gap space may be formed between a lower surface of the cover and the electrode pattern.

Preferably, the motion gesture sensing device may further include one or more electric field intensifying member disposed in the gap space such that a lower end thereof is in contact with the electrode pattern and an upper end thereof is in contact with the lower surface of the cover, the electric field intensifying member including a conductive material electrically connected to the electrode pattern.

More preferably, the one or more electric field intensifying member may have an elastic force so that the one or more intensifying member is deformed correspondingly to the curved shape of the cover.

Here, a plurality of the electric field intensifying members may be distributed and disposed in the gap space.

Furthermore, the one or more electric field intensifying member may be configured to recognize a user's touch to the cover.

As an example, the one or more electric field intensifying member may include a sponge or rubber block containing an electrically conductive material and having an elastic force.

As an example, the one or more electric field intensifying member may include a coil spring formed of a conductive material and having one side contacting the electrode pattern and the other side contacting the lower surface of the cover.

As an example, the one or more electric field intensifying member may include a leaf spring formed of a conductive material and having a pressure-deformable elastic part with an upper portion contacting the lower surface of the cover and support legs contacting the electrode pattern, the support legs being connected to both sides of the elastic part.

According to another aspect of the present disclosure, there is provided a vehicle-mounted unit manipulation system including: the motion gesture sensing device; and one or more vehicle-mounted units operated according to a command provided from the main board of the motion gesture sensing device.

As an example, the motion gesture sensing device may be disposed on an overhead console of a vehicle, determines the gesture of an occupant based on the motion of the occupant in a space in front of the overhead console, and operates the one or more vehicle-mounted units corresponding to the gesture of the occupant.

Furthermore, the motion gesture sensing device may be configured to recognize the motion of the occupant, determine the gesture according to the motion of the occupant, and transmit the command to perform the specific function of a particular vehicle-mounted unit among the one or more vehicle-mounted units according to the gesture of the occupant.

As an example, the one or more vehicle-mounted unit may include a lighting unit including: a plurality of lamps emitting light; and a lamp controller configured to control an operation of respective lamps according to the command provided from the main board.

As an example, the one or more vehicle-mounted units may include a sunroof unit including: a sunroof window mounted on a vehicle ceiling to open and close; and a controller configured to control an operation of the sunroof window according to the command provided from the main board.

According to the present disclosure as described above, the sensing space is formed with an electric field so that a change in the electric field according to a motion gesture of an occupant in the sensing space is recognized to operate a function of respective vehicle-mounted unit.

Furthermore, various vehicle-mounted units can be integrally manipulated through the occupant's motion gesture using the vehicle-mounted unit manipulation system to which the motion gesture sensing device is applied.

Effects of the present disclosure are not limited to those mentioned above, and other effects not mentioned will be clearly understood by those of ordinary skill in the art from the description below.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Although preferred embodiments of the present disclosure will now be described in detail with reference to the accompanying drawings, the present disclosure is not limited or restricted to the embodiments.

In order to describe the configuration and the operational advantages of the present closure achieved by implementing the present disclosure, preferred embodiments of the present disclosure will be illustrated and described below.

First, the terminology used herein is for the purpose of describing particular embodiments only and is not intended to be limiting the present disclosure. As used herein, the singular forms are intended to include the plural forms as well, unless the context clearly indicates otherwise. It will be further understood that the terms "comprises,", "includes", or the like when used herein, specify the presence of stated features, integers, steps, operations, elements, components, or combinations thereof, but do not preclude the presence or addition of one or more other features, integers, steps, operations, elements, components, or combinations thereof.

In describing the present disclosure, if it is determined that a detailed description of a related known configuration or function may obscure the gist of the present disclosure, the detailed description thereof will be omitted.

The present disclosure provides a motion gesture sensing device for recognizing a user's motion and a vehicle-mounted unit manipulation system to which the motion gesture sensing device is applied for operating various vehicle-mounted units.

The motion gesture sensing configuration proposed by the present disclosure may provide a sensing space formed of an electric field so that a change in the electric field according to the user's motion in the sensing space is detected to recognize a switching operation according to the user's gesture based on the detected change.

Hereinafter, a motion gesture sensing device and a vehicle-mounted unit manipulation system will be described through embodiments according to the present disclosure. For convenience of description, a vehicle lighting unit will be described as an embodiment, but the present disclosure is not limited to the vehicle lighting unit. The present disclosure can be applied to a variety of vehicle-mounted units.

Figure 1:
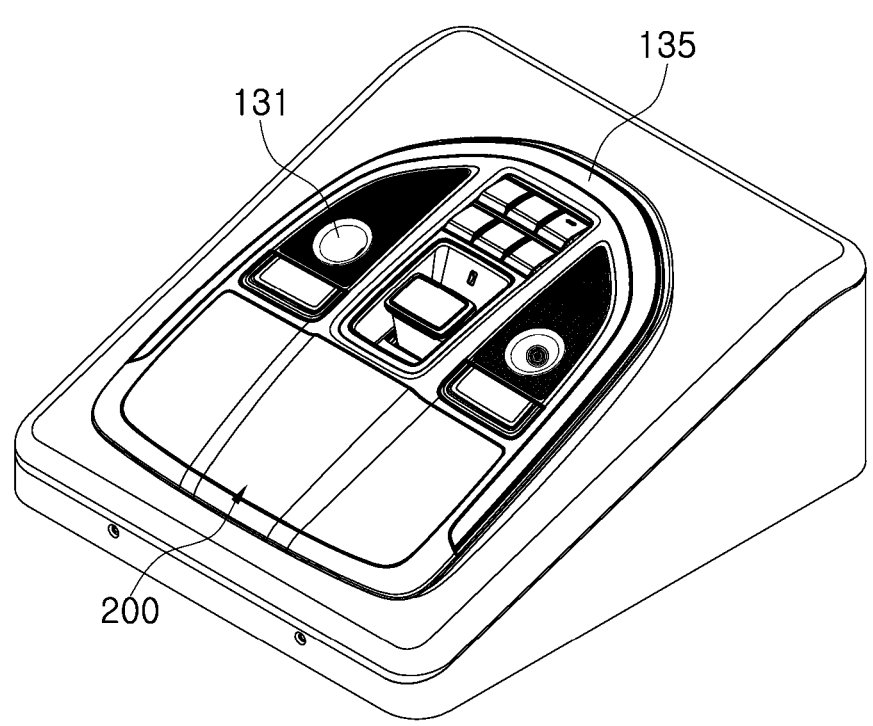
FIG. 1 is a view illustrating an embodiment of a vehicle lighting unit to which a motion gesture sensing device according to the present disclosure is applied.

FIG. 1 is a view illustrating an embodiment of a vehicle lighting unit to which a motion gesture sensing device according to the present disclosure is applied.

The vehicle lighting unit 100 may be mounted inside of a vehicle, and may include various lamps 131 and 135. In this embodiment, a lighting unit disposed on an overhead console of a vehicle will be described as an example.

The vehicle lighting unit 100 may include a plurality of lamps 131 and 135 and a controller (not shown) for operating the lamps, respectively. In addition, the vehicle lighting unit 100 may be provided with a motion gesture sensing device 200 therein.

A detailed configuration of the vehicle lighting unit 100 will be described with reference to FIGS. 2 and 4.

Figure 2:
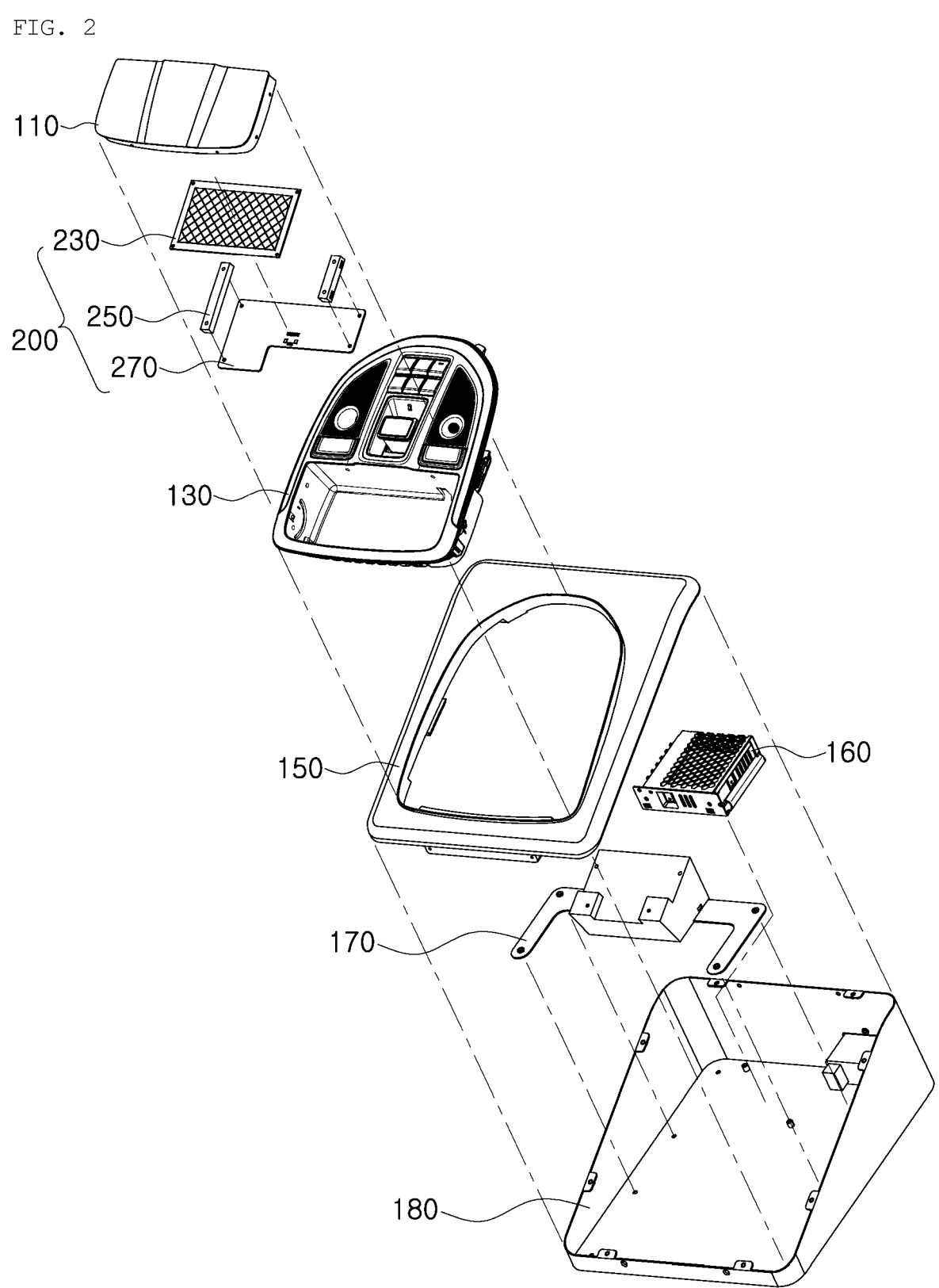
FIG. 2 is an exploded perspective view illustrating the embodiment of the vehicle lighting unit to which the present disclosure is applied.

FIG. 2 is an exploded perspective view illustrating the embodiment of the vehicle lighting unit to which the present disclosure is applied.

The vehicle lighting unit 100 includes a cover 110, a motion gesture sensing device 200, a lighting means 130, an upper casing 150, a power supply means 160, a support means 170, a lower casing 180, and the like.

The motion gesture sensing device 200 may include a sensing board 230, a gesture determination board 270, a main board (not shown), a bracket 250, and the like. Depending on circumstances, the cover 110 may be integrated into the motion gesture sensing device 200 as one component.

The sensing board 230 may include an electrode pattern for forming an electric field in a front space of the cover 110 to form a sensing space, and an electrode pattern for detecting a change in the electric field according to a motion of an occupant in the sensing space.

The sensing board 230 may be coupled to the gesture determination board 270 through the bracket 250, and the sensing board 230 and the gesture determination board 270 may be electrically connected to each other through their respective signal lines.

The gesture determination board 270 may determine an occupant's gesture on the basis of the change in the electric field sensed by the sensing board 230. That is, it is possible to determine what kind of gesture the occupant's motion is on the basis of the electric field change pattern that is changed according to the occupant's motion.

The main board (not shown) may be integrally configured with the gesture determination board 270 or otherwise may be configured separately. The main board may be set with command information for a specific function of a unit corresponding to a specific gesture, and may provide the command information corresponding to the gesture determined by the gesture determination board 270 to the corresponding unit so that the unit can perform the specific function.

The lighting means 130 may include a lamp and a lamp controller. The lighting means 130 may be provided with a switch so that the lighting means can be operated by occupant's direct manipulation of the switch, or otherwise the lighting means may be operated according to a command transmitted from the motion gesture sensing device 200.

Figure 3A:
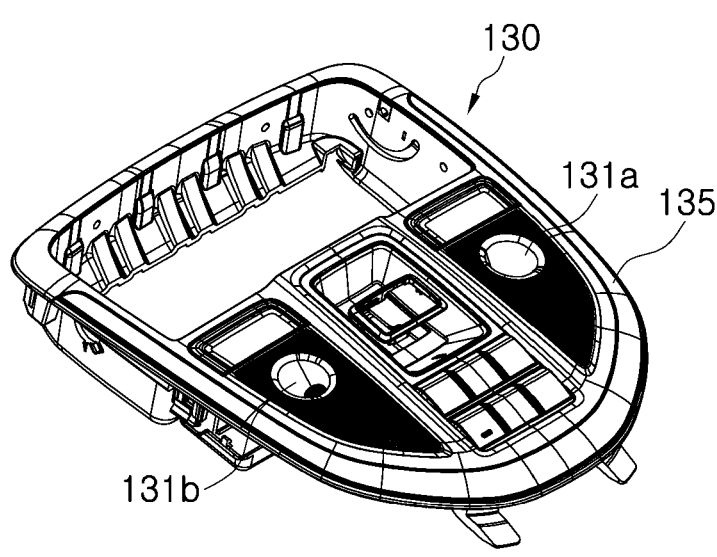
FIGS. 3A and 3B are views illustrating an embodiment of a lighting means in the vehicle lighting unit to which the motion gesture sensing device according to the present disclosure is applied.
Figure 3B:
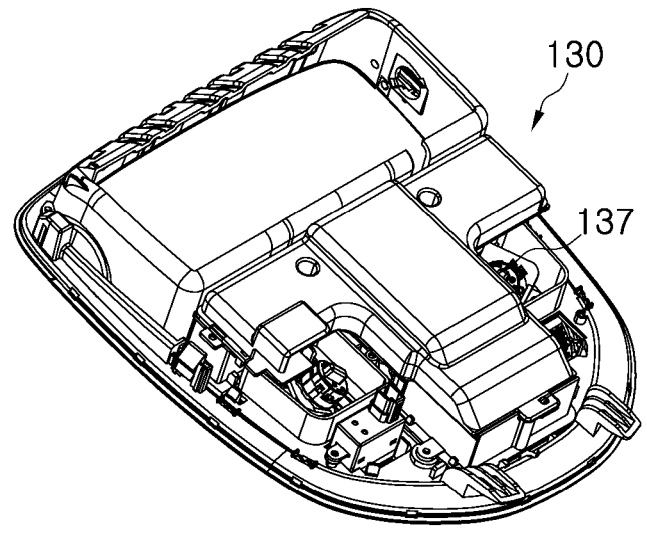

In relation to the lighting means 130, a reference will also be made to an embodiment of the lighting means 130 of FIGS. 3A and 3B.

In this embodiment, the lighting means 130 is the form that may be disposed on a vehicle overhead console, and the shape and configuration thereof may be variously changed according to the location of a vehicle.

The lighting means 130 may include a plurality of lamps, particularly, left and right map lamps 131a and 131b, a mood lamp 135, or the like.

In addition, the lighting means 130 may include a controller 137 configured to operate respective lamps. Here, the controller 137 may operate respective lamps according to a command from the motion gesture sensing device 200.

As in the present embodiment, a mounting portion for the motion gesture sensing device 200 may be provided in the lower space of the lighting means such that the motion gesture sensing device 200 is specialized for the function of operating the lighting means 130 so that the motion gesture sensing device can be located adjacent to the lighting means 130.

The upper casing 150 may be disposed to support the lighting means 130 on which the motion gesture sensing device 200 has been inserted and mounted.

The power supply means 160 may supply power to the motion gesture sensing device 200, the lighting means 130, and the like.

The support means 170 serves to support the motion gesture sensing device 200 and the lighting means 130, and preferably, the support means 170 may be provided with a shock-relieving member to prevent an impact occurring during vehicle driving from being transferred to the motion gesture sensing device 200.

The lower casing 180 may be coupled to the upper casing 150 to provide an internal space in which the aforementioned components may be seated while being protected.

The respective aforementioned components may be variously modified under certain circumstances. For example, the shapes of the lighting means 130, the upper casing 150, the lower casing 180, etc. may be changed to correspond to a mounting position inside of a vehicle. Also, the upper casing 150, the lower casing 180, or the like may be removed if needed.

Figure 4:
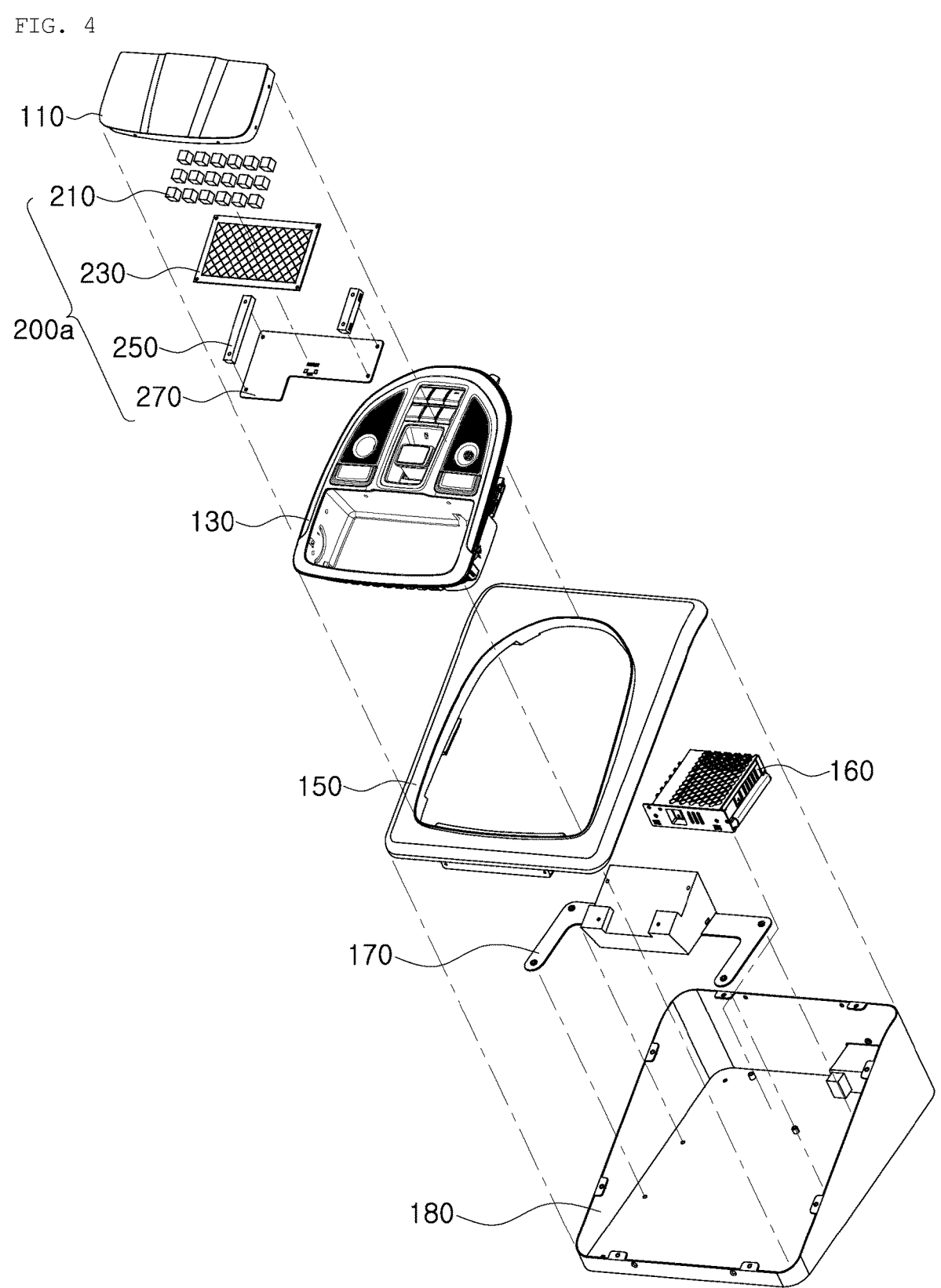
FIG. 4 is an exploded perspective view illustrating another embodiment of a vehicle lighting unit to which the present disclosure is applied.

FIG. 4 is an exploded perspective view illustrating another embodiment of a vehicle lighting unit to which the present disclosure is applied.

The embodiment of FIG. 4 is a modification of the embodiment of FIG. 2 described above, so the configurations of the two embodiments are similar to each other.

In this embodiment, unlike the embodiment of FIG. 2, an electric field intensifying member 210 may be provided in a motion gesture sensing device 200a.

The electric field intensifying member 210 may be disposed between the sensing board 230 and the cover 110. A gap space exists between an upper surface of the sensing board 230 and a lower surface of the cover 110, and the electric field intensifying member 210 may be disposed in the gap space.

The electric field intensifying member 210 may include an electrically conductive material having electrical properties, and may be positioned on the upper surface of the sensing board 230 to be electrically connected to the electrode pattern of the sensing board 230.

In addition, the electric field intensifying member 210 may have an elastic force so that the shape thereof may be defamed to correspond to the curved shape of the cover 110.

In the vehicle lighting unit 100, the lamp may be operated in response to a specific gesture according to an occupant's motion through the motion gesture sensing devices 200 and 200a provided by the present disclosure.

Figure 5:
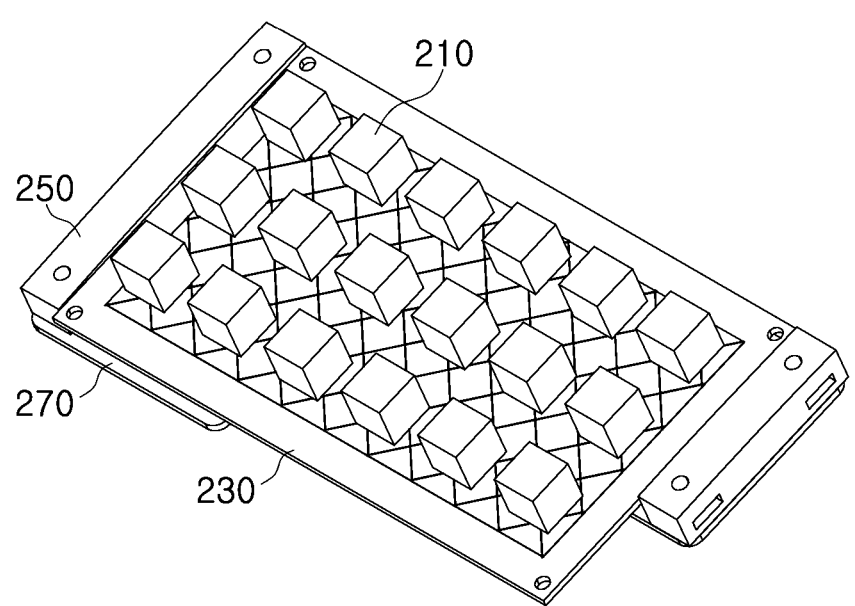
FIGS. 5, 6A, and 6B are views illustrating a first exemplary configuration of a motion gesture sensing device according to the present disclosure.
Figure 6A:
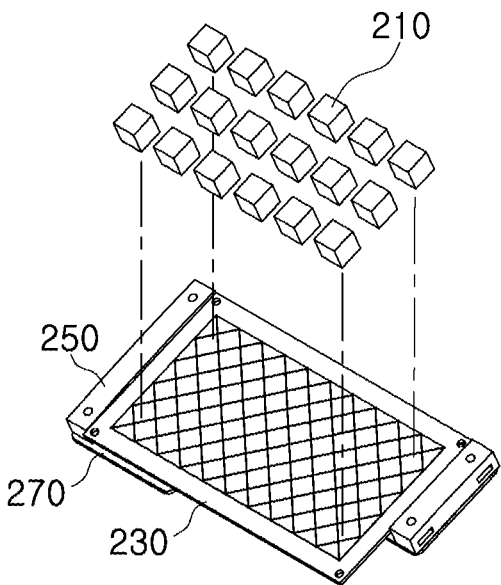
Figure 6B:
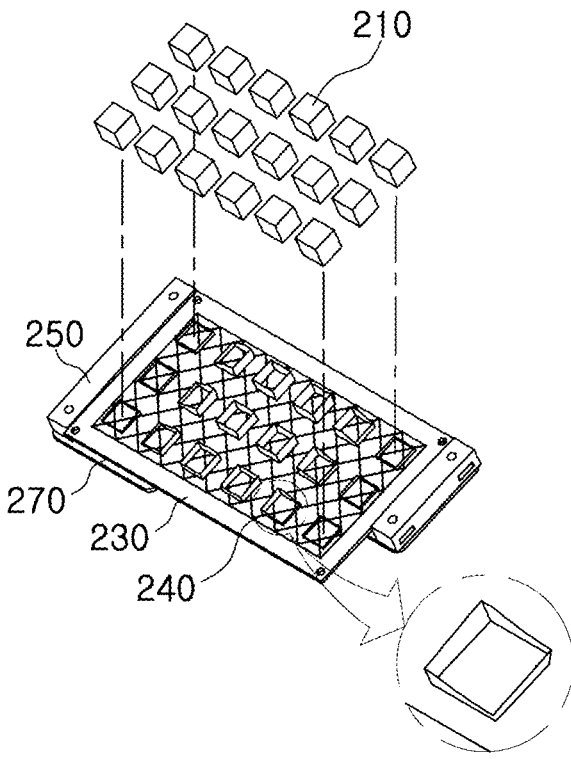

FIGS. 5, 6A, and 6B are views illustrating a first exemplary configuration of a motion gesture sensing device according to the present disclosure.

The motion gesture sensing device 200a may include an electric field intensifying member 210, a sensing board 230, a gesture determination board 270, a bracket 250, and the like.

The electric field intensifying member 210 may be fabricated into a block shape, and may include an electrically conductive material having electrical conductivity. The electric field intensifying member 210 may be in contact with the electrode pattern on the sensing board 230 so that the electric field intensifying member and the sensing board are electrically connected to each other.

In addition, the electric field intensifying member 210 has an elastic force so that a shape thereof can be freely deformed when pressed. As an example, the electric field intensifying member 210 may be fabricated to have elasticity and electrical properties by providing a flexible material having elasticity with a conductive material such as a sponge or rubber.

The electric field intensifying member 210 may be freely deformed in shape to correspond to the curved shape of the lower surface of the cover 110 while being pressed by the cover 110 spaced apart from the sensing board 230.

The electric field intensifying member 210 may be formed into a single block that corresponds to the size of the electrode pattern on the sensing board 230 so as to cover the entire electrode pattern. However, the electric field intensifying member may be preferably formed into a plurality of blocks, which may be distributed and disposed on the electrode pattern on the sensing board 230. That is, the electric field intensifying member 210 may be dispersedly disposed in the gap space between the sensing board 230 and the cover 110.

Since the electric field intensifying member 210 is in close contact with the lower surface of the cover 110 while being electrically connected to the electrode pattern of the sensing board 230, upon an occupant's touch to the upper surface of the cover 110, the electrode pattern of the sensing board 230 may recognize the occupant's touch through the electric field intensifying member 210. Such touch recognition may function as a recognition of a switching operation.

The number and arrangement positions of the electric field intensifying members 210 may be variously changed to correspond to the electrode pattern of the sensing board 230.

As illustrated in FIG. 6A, the electric field intensifying member 210 may be disposed on the sensing board 230 using an adhesive material or the like. Alternatively, as illustrated in FIG. 6B, a mounting partition wall 240 may be provided at a seating portion of the electric field intensifying member 210 on the sensing board 230, and the electric field intensifying member 210 may be inserted into and disposed on the mounting partition wall 240.

An electrode for forming a sensing space with an electric field on the front side thereof and an electrode for sensing a change in the electric field according to an occupant's motion in the sensing space may be provided on the sensing board 230.

The sensing board 230 will be described with reference to FIGS. 7 and 8 together.

Figure 7:
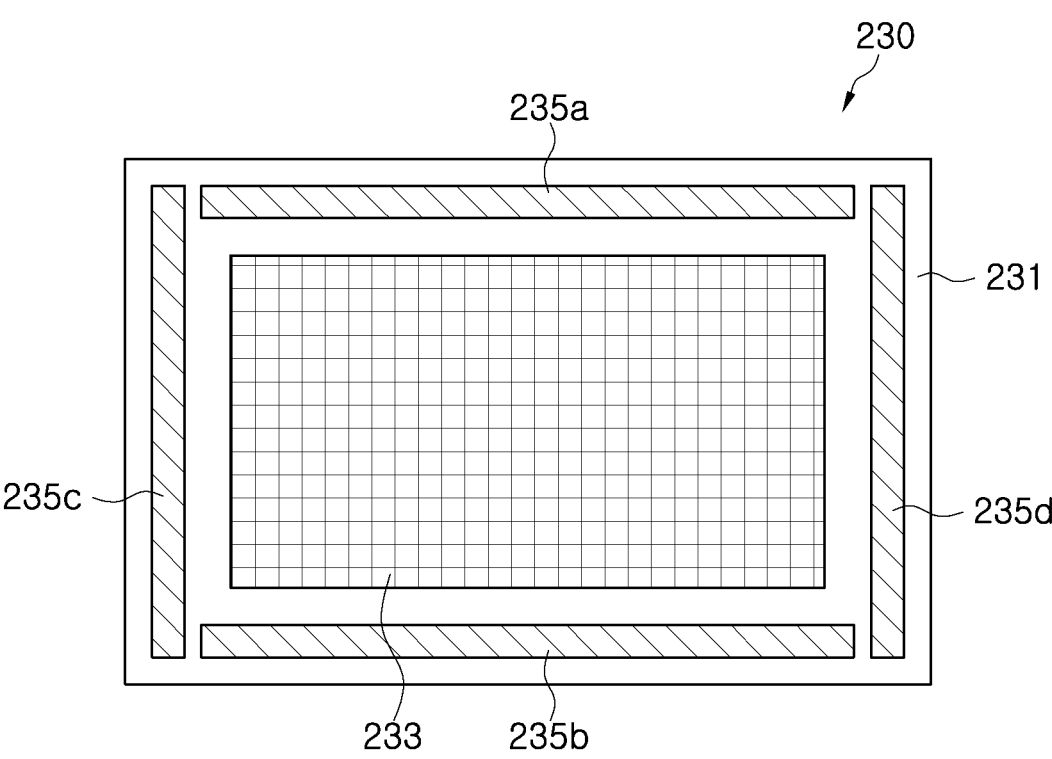
FIG. 7 is a view illustrating an embodiment of a sensing board of the motion gesture sensing device according to the present disclosure.
Figure 8:
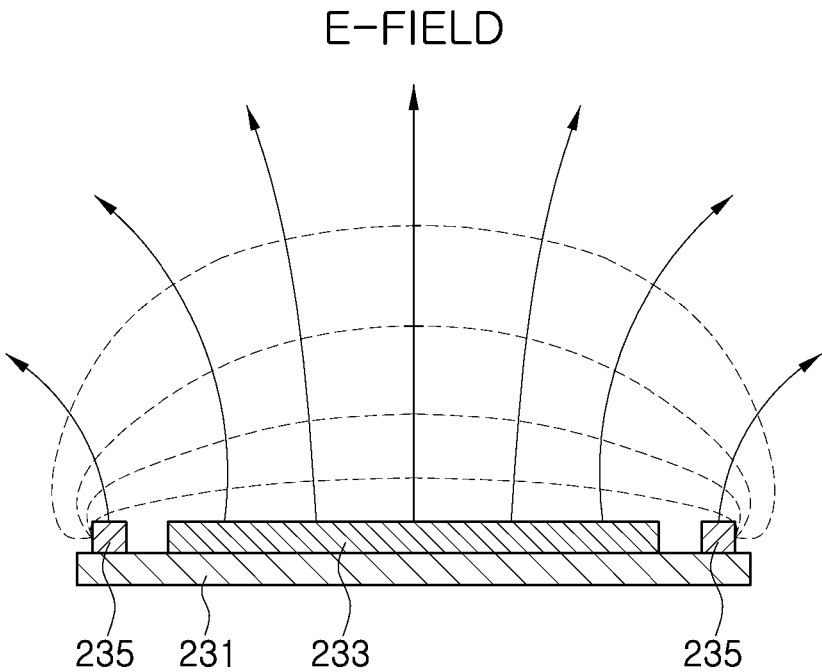
FIG. 8 is a view illustrating an example of forming an electric field in a sensing space through the motion gesture sensing device according to the present disclosure.

FIG. 7 is a view illustrating an embodiment of a sensing board of the motion gesture sensing device according to the present disclosure, and FIG. 8 is a view illustrating an example of forming an electric field in a sensing space through the motion gesture sensing device according to the present disclosure.

A transmitter electrode 233 and receiver electrodes 235a, 235b, 235c, and 235d may be formed on a substrate 231 of the sensing board 230.

The transmitter electrode 233 may be formed in the central region of the substrate 231, and the receiver electrodes 235a, 235b, 235c, and 235d may be separately formed on upper, lower, left, and right outer portions of the substrate 231.

The upper receiver electrode 235a, the lower receiver electrode 235b, the left receiver electrode 235c, and the right receiver electrode 235d may be disposed about and spaced apart from the transmitter electrode 233.

As illustrated in FIG. 8, the transmitter electrode 233 may form an electric field on the front side thereof to form a sensing space. In addition, the receiver electrodes 235 may detect a change in the electric field according to an occupant's motion in the sensing space.

The electrode pattern of the sensing board 230 may be variously modified as needed.

Figure 9:
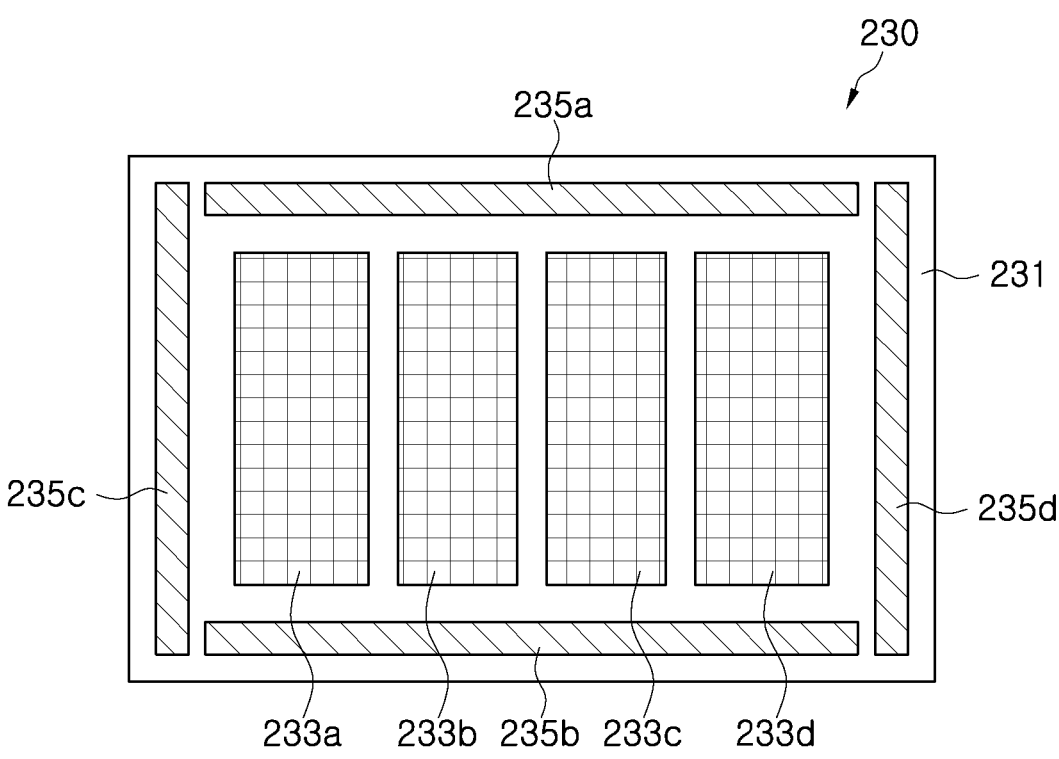
FIG. 9 is a view illustrating another embodiment of the sensing board of the motion gesture sensing device according to the present disclosure.

In relation to the electrode pattern deformation of the sensing board, FIG. 9 illustrates another embodiment of the sensing board of the motion gesture sensing device according to the present disclosure.

Alternatively, a plurality of transmitter electrodes 233a, 233b, 233c, and 233d may be formed in the central region of the sensing board 230. The plurality of transmitter electrodes 233a, 233b, 233c, and 233d may be formed in a central region of the sensing board 230 in the form of being spaced apart from each other. In this case, the respective transmitter electrodes 233a, 233b, 233c, and 233d may have different outputs. For example, the outer side transmitter electrodes 233a and 233d may have a stronger output than the center side transmitter electrodes 233b and 233c, which makes it possible to further intensify the outer region of the electric field formed on the front side.

In addition, although each of receiver electrode 235a, 235b, 235c, and 235d is famed on the upper, lower, left, and right outer sides of the sensing board 230 in this embodiment, the number and position of the receiver electrodes may be adjusted.

A controller (not shown) may be provided on the sensing board 230 or on the gesture determination board 270 electrically connected to the sensing board 230 for supplying current and controlling output to the transmitter electrode 233 and the receiver electrodes 235a, 235b, 235c, and 235d of the sensing board 230.

Figure 10:
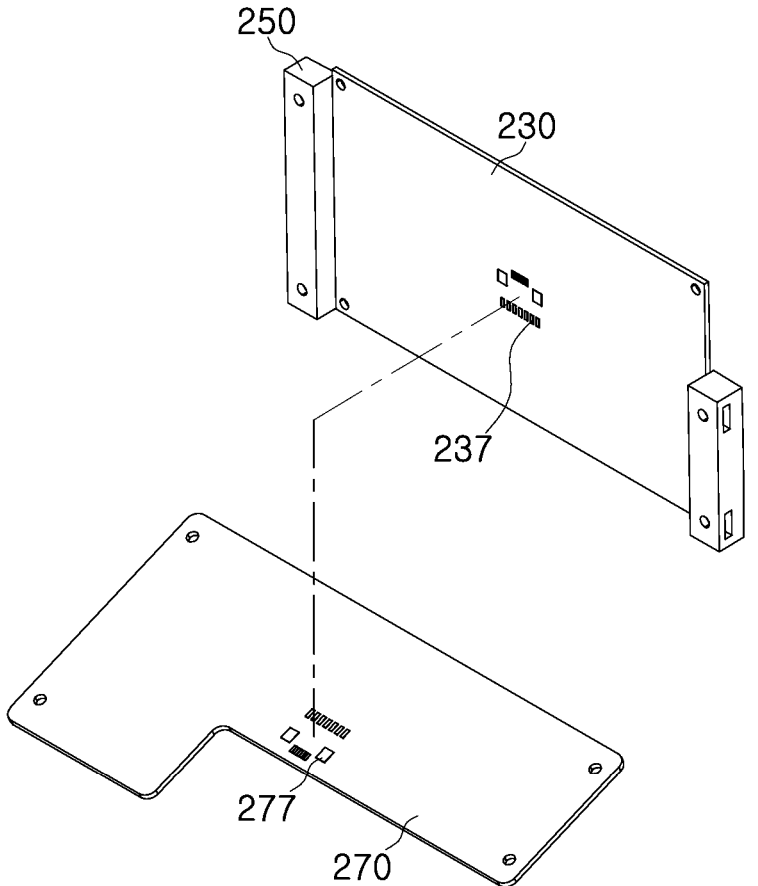
FIG. 10 is a view illustrating an embodiment of a coupling structure for a sensing board and a gesture determination board in the motion gesture sensing device according to the present disclosure.

A signal line of the sensing board 230 and a signal line of the gesture determination board 270 may be electrically connected to each other. This configuration will also be described with reference to an embodiment of a coupling structure between the sensing board and the gesture determination board of the motion gesture sensing device according to the present disclosure as illustrated in FIG. 10.

A signal line connection terminal 237 may be provided on the lower surface of the sensing board 230, and the signal line connection terminal 237 may be electrically connected to the transmitter electrode 233 and the receiver electrodes 235a, 235b, 235c, and 235d formed on the upper surface of the sensing board 230.

In addition, a signal line connection terminal 277 may be provided on the upper surface of the gesture determination board 270 to correspond to the signal line connection terminal 237 of the sensing board 230. The signal line connection terminal 237 of the sensing board 230 and the signal line connection terminal 277 of the gesture determination board 270 are electrically connected to each other to enable mutual signal transmission.

The sensing board 230 and the gesture determination board 270 are coupled to each other through the bracket 250, and may be stably mounted on a device casing or the like through the bracket 250.

Furthermore, according to the present disclosure, the electric field intensifying member 210 may be variously modified in many embodiments, which will now be described.

Figure 11A:
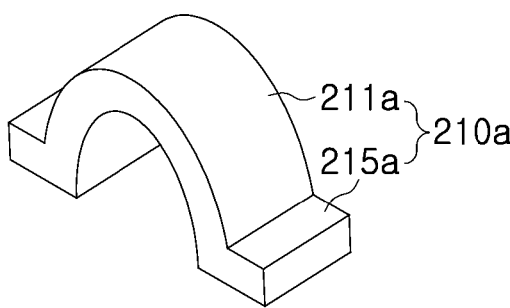
FIGS. 11A and 11B are views illustrating a second exemplary configuration of a motion gesture sensing device according to the present disclosure.
Figure 11B:
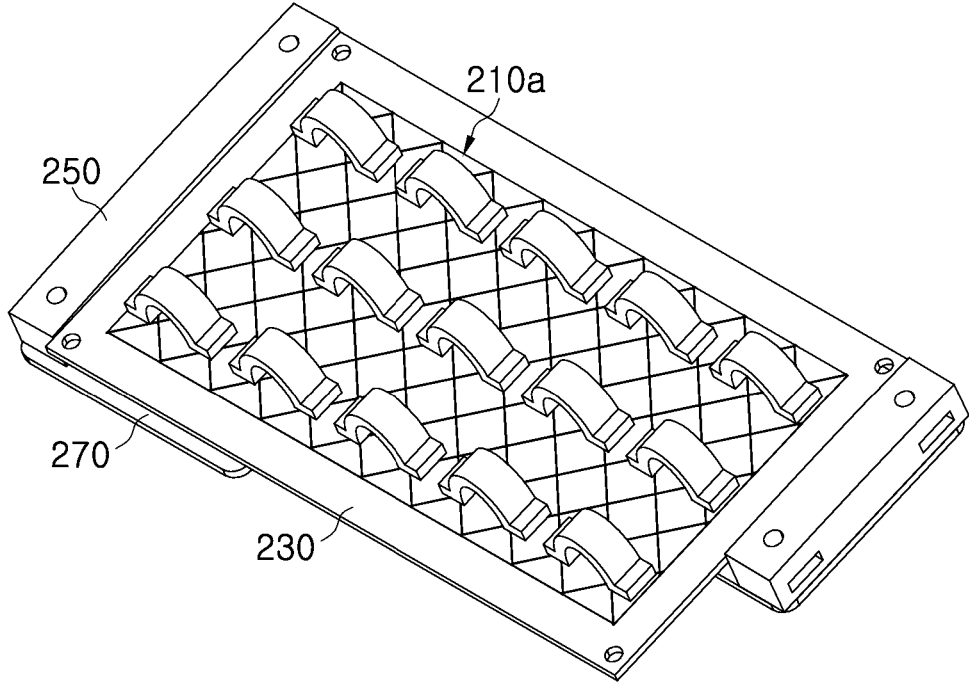

FIGS. 11A and 11B are views illustrating a second exemplary configuration of a motion gesture sensing device according to the present disclosure.

A leaf spring may be applied as the electric field intensifying member 210a.

The electric field intensifying member 210a may include an elastic part 211a that is deformed when pressed, and support legs 215a that support the elastic part 211a.

The elastic part 211a and the support legs 215a of the electric field intensifying member 210a may include a conductive material or may be made of a metal material.

The support legs 215a are electrically connected to the electrode pattern of the sensing board 230, and an upper side of the elastic part 211a may be pressed and deformed according to the shape of the lower surface of the cover 110 while being in contact with the lower surface of the cover 110.

A plurality of electric field intensifying members 210a may be arranged on the upper surface of the sensing board 230 to correspond to the size and position of the electrodes formed on the sensing board 230.

Figure 12A:
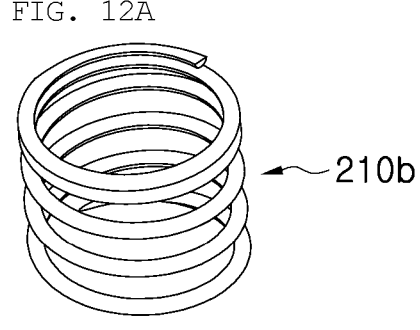
FIGS. 12A and 12B are views illustrating a third exemplary configuration of a motion gesture sensing device according to the present disclosure.
Figure 12B:
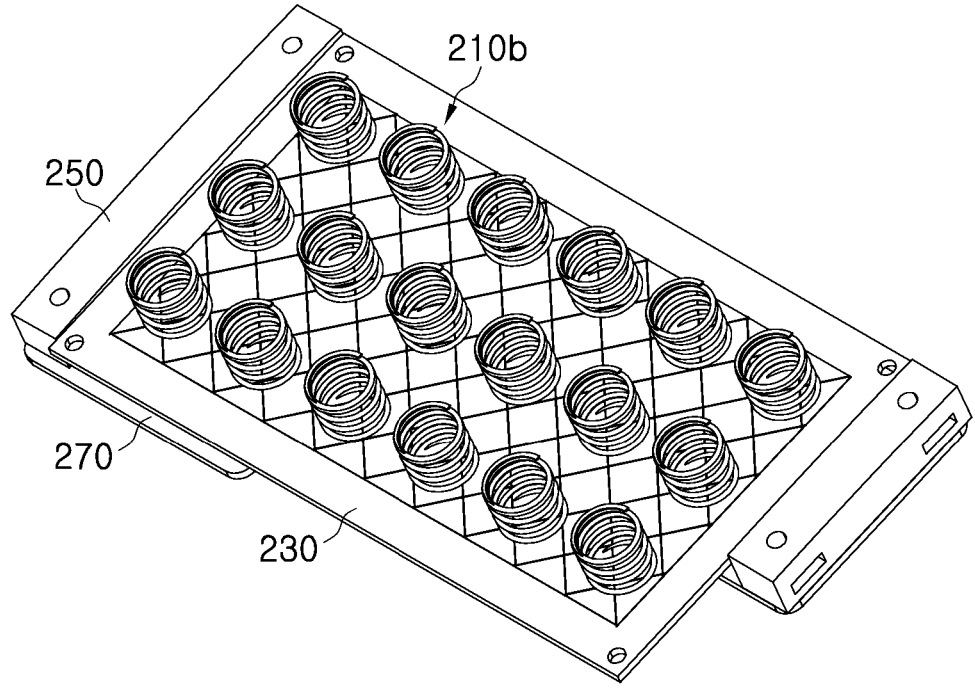

FIGS. 12A and 12B are views illustrating a third exemplary configuration of a motion gesture sensing device according to the present disclosure.

A coil spring may be applied as the electric field intensifying member 210b.

The electric field intensifying member 210b of the coil spring has one side that may be in contact and electrically connected with the electrode pattern of the sensing board 230, and another side that may be in contact with the lower surface of the cover 110 and may be pressed and deformed according to the shape of the lower surface of the cover 110.

A plurality of electric field intensifying members 210b may be arranged on the upper surface of the sensing board 230 to correspond to the size and position of the electrodes famed on the sensing board 230.

Figure 13:
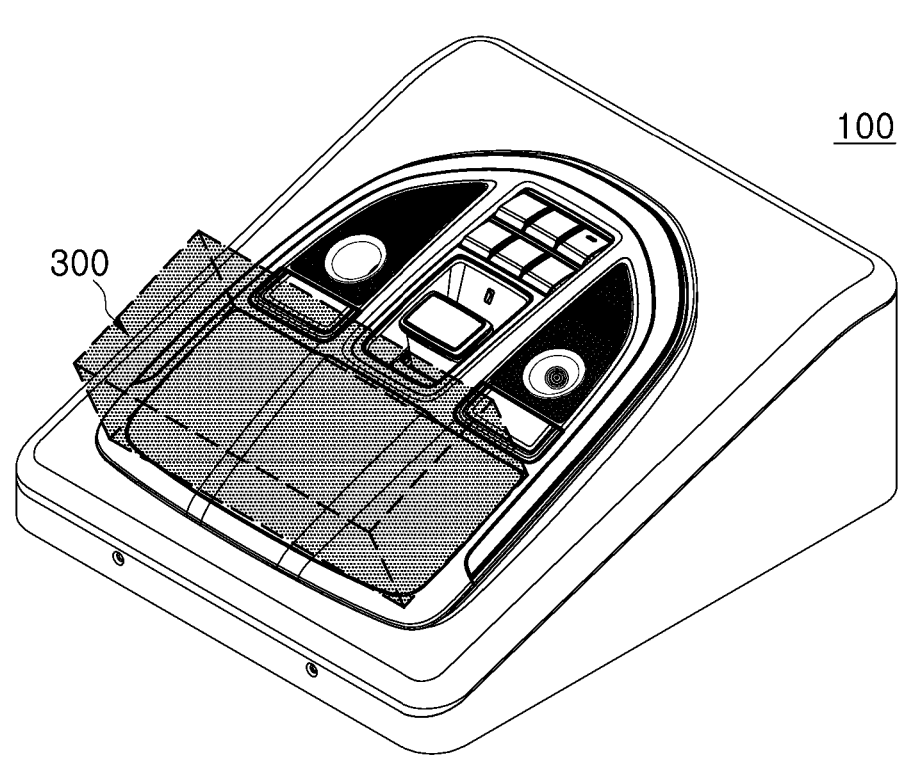
FIGS. 13, 14A, and 14B are views illustrating an example in which a sensing space is formed in an embodiment of a vehicle lighting unit to which the motion gesture sensing device according to the present disclosure is applied.
Figure 14A:
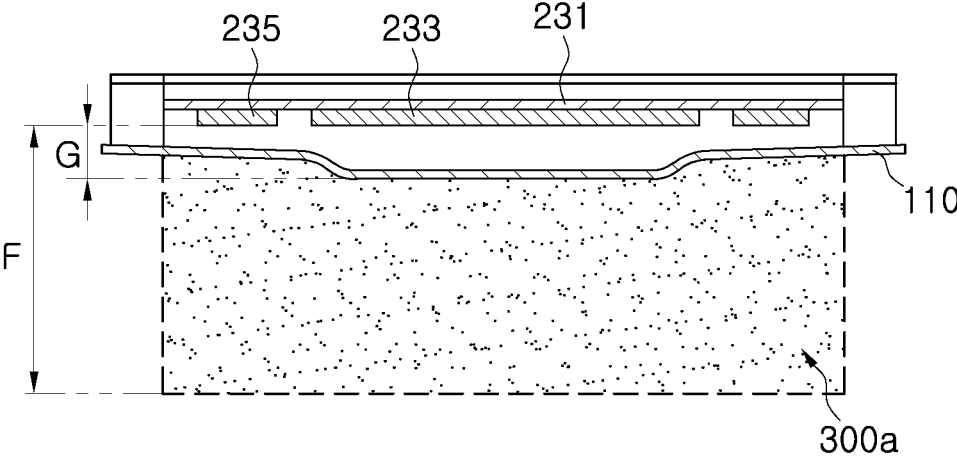
Figure 14B:
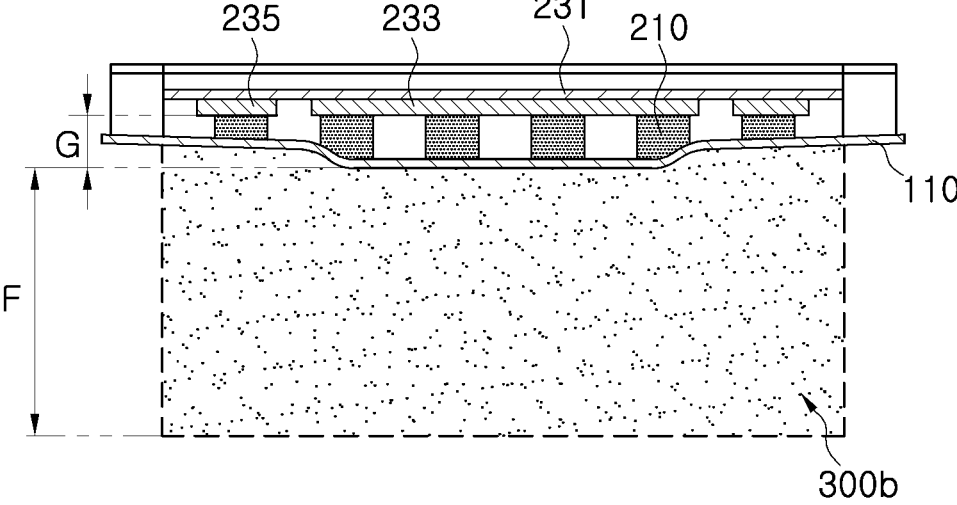

A case in which the motion gesture sensing device according to the present disclosure is applied to a vehicle lighting unit has been described through the above embodiment. The operation relationship of the present disclosure will be described with reference to an example in which a sensing space is formed in an embodiment of a vehicle lighting unit to which the motion gesture sensing device according to the present disclosure as illustrated in FIGS. 13, 14A, and 14B is applied.

For the simplification of the drawing configuration, the reference numbers of respective components will be used with reference to the aforementioned embodiments.

In the vehicle lighting unit 100 disposed on the overhead console, the motion gesture sensing device 200 may be disposed in a space below the lighting means 130.

The motion gesture sensing device 200 may form a sensing space 300 with an electric field in front of the cover 110.

The electric field is changed according to an occupant's motion in the sensing space 300, and it is possible to determine what gesture the occupant has made through the change pattern of the electric field.

FIG. 14A illustrates a sensing space for the embodiment of the vehicle lighting unit of FIG. 2 as described above, and FIG. 14B illustrates a sensing space for the embodiment of the vehicle lighting unit of FIG. 4.

The sensing spaces 300a and 300b are formed with an electric field through the transmitter electrode 233 formed on the sensing board 230, and a change in the electric field on the sensing spaces 300a and 300b may be detected through the receiver electrodes 235.

The electrode pattern of the sensing board 230 is covered by the cover 110, whereby a gap space G is formed between the sensing board 230 and the cover 110. In particular, the cover 110 has a curved surface corresponding to the position of a vehicle on which the vehicle lighting unit 100 is mounted, and thus the gap space G is further enlarged in a certain portion.

The gap space reduces the sensing space formed with the electric field. For example, the sensing space F formed with the electric field as illustrated in FIG. 14A may be formed as a predetermined area starting from the upper surfaces of the electrode patterns 233 and 235 of the sensing board 230. However, due to the gap space G between the sensing board 230 and the cover 110, the actual sensing space (F-G) capable of recognizing the occupant's gesture is reduced to a volume excluding the gap space.

As the actual sensing space is reduced, the sensing of an occupant's gesture can be performed only in the vicinity of the vehicle lighting unit 100, which may greatly reduce the allowable sensing range for the occupant's motion gesture.

In order to increase the allowable sensing range, the sensing space may be enlarged by increasing the output of the electrode patterns 233 and 235 of the sensing board 230. However, when the sensing space is enlarged by increasing the output, the sensing reliability and accuracy are rapidly deteriorated due to noise sensitivity in response to ambient noise.

With the provision of the electric field intensifying member 210 as illustrated in FIG. 14B, it is possible to reduce the loss of the sensing space occurring due to the gap space G.

The electric field intensifying member 210 disposed in the gap space G between the sensing board 230 and the cover 110 is electrically connected to the electrode patterns 233 and 235 of the sensing board 230 so that the electric field intensifying member may be used as a kind of dummy electrode.

The sensing space F formed with the electric field may start from the upper surface of the cover 110, since the electric field intensifying member 210 fills the gap space G. Accordingly, the loss of the sensing space occurring due to the gap space G may be eliminated.

Although the embodiment in which the motion gesture sensing device according to the present disclosure is applied to the vehicle lighting unit has been illustrated, the present disclosure provides a vehicle-mounted unit manipulation system in which various vehicle-mounted units may be integrated and manipulated without being limited to the vehicle lighting unit.

Figure 15:
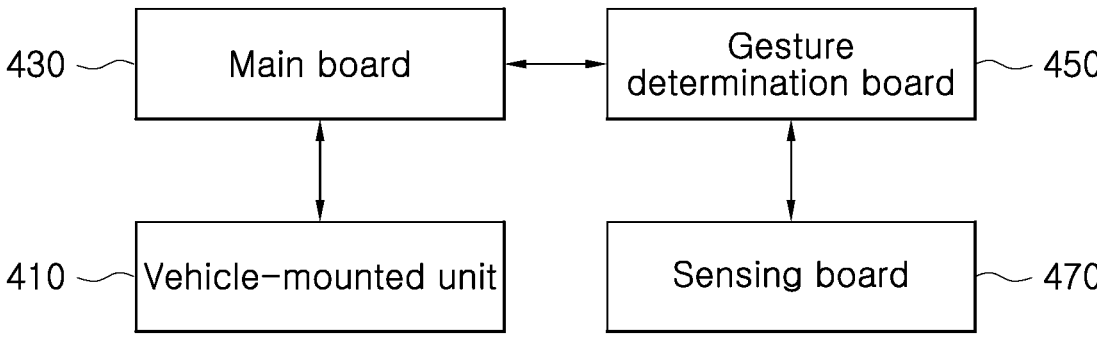
FIG. 15 is a block diagram illustrating an embodiment of a vehicle-mounted unit manipulation system to which the motion gesture sensing device according to the present disclosure is applied.

FIG. 15 is a block diagram illustrating an embodiment of a vehicle-mounted unit manipulation system to which the motion gesture sensing device according to the present disclosure is applied.

The vehicle mounted unit manipulation system according to the present disclosure may include the motion gesture sensing device as described above, vehicle-mounted units 410 mounted on a vehicle to perform respective functions thereof, and the like.

The motion gesture device may form a sensing space with an electric field using the configuration including the sensing board 470, the gesture determination board 450, the main board 430, etc., and recognize a pattern of electric field change according to an occupant's motion in the sensing space to determine a corresponding occupant's gesture. In addition, the motion gesture device may transmit a manipulation command to a specific vehicle-mounted unit to perform a specific function of the corresponding vehicle-mounted unit set in response to the determined gesture.

Figure 16:
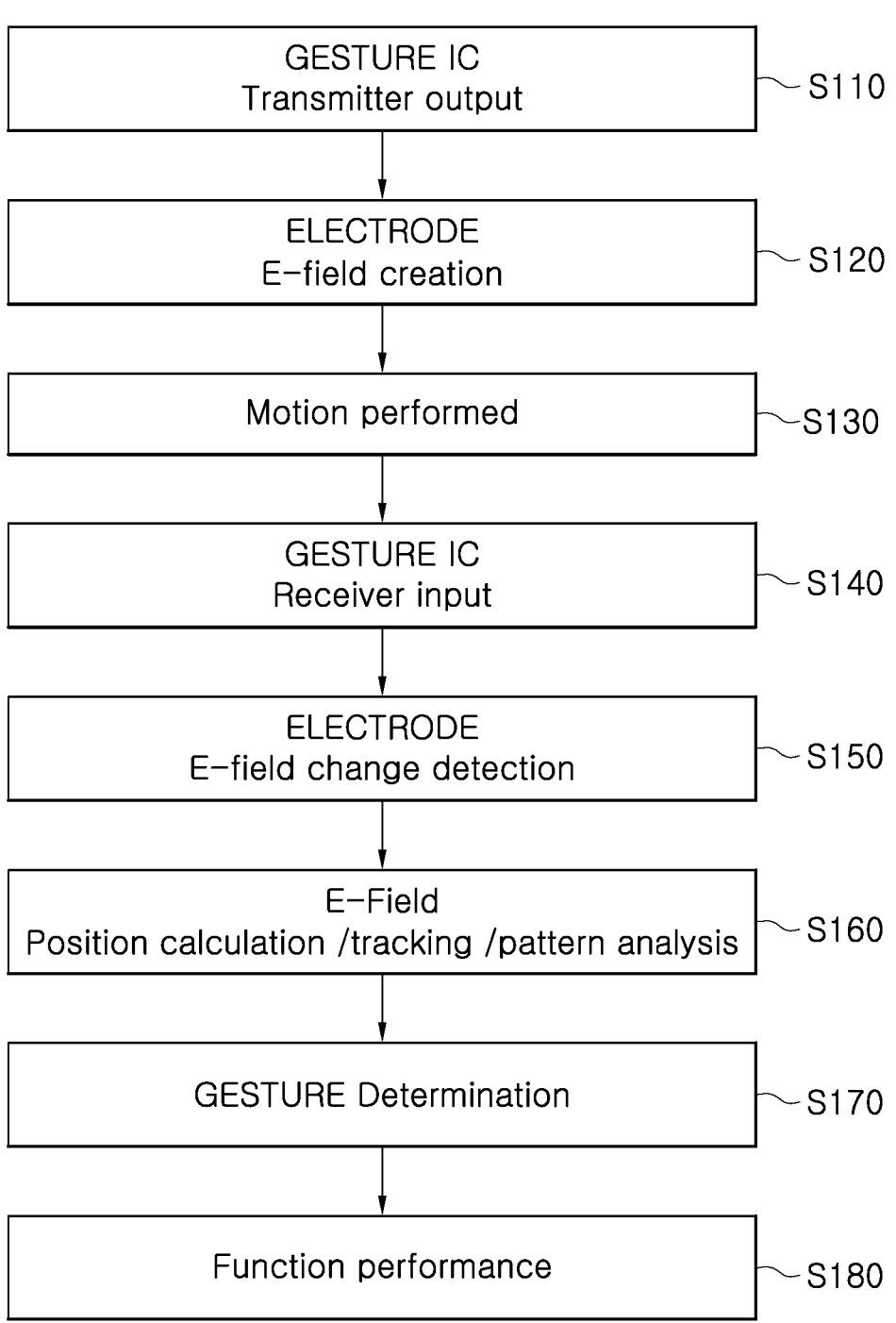
FIG. 16 is a flowchart illustrating an operation of the vehicle-mounted unit manipulation system to which the motion gesture sensing device according to the present disclosure is applied.

An operation process of the vehicle mounted unit manipulation system to which the motion gesture sensing device according to the present disclosure is applied will be described with reference to FIG. 16.

A current may be applied to the transmitter electrode of the sensing board 470 to generate an electric field in front of the sensing board 470 (S120) using an output from the transmitter electrode (S110). The predetermined area in which an electric field is formed may be applied as a sensing space for sensing an occupant's motion.

When the occupant's motion S130 is performed in the sensing space, a change in the electric field occurs in the sensing space. Since a signal input through the receiver electrodes of the sensing board 470 (S140) reflects the change in the electric field in the sensing space, the sensing board 470 may detect this electric field change (S150).

The gesture determination board 450 analyzes the electric field change detected by the sensing board 470 (S160). For example, the gesture determination board may analyze a position, a path, a pattern, etc. in the electric field change to determine which gesture the occupant has made (S170).

A command for performing a function of a specific unit in response to respective occupant's gestures is set in the main board 430, and the main board 430 recognizes a command corresponding to the occupant's gesture determined by the gesture determination board 450 and transmits a command for performing the function of the vehicle-mounted unit 410 corresponding thereto to the corresponding vehicle-mounted unit.

In response to the command from the main board 430 for performing the corresponding function, the vehicle-mounted unit 410 may perform a corresponding function (S180).

According to the present disclosure, various vehicle-mounted units can be integrally manipulated through the occupant's motion gesture using the vehicle-mounted unit manipulation system to which the motion gesture sensing device is applied.

The vehicle-mounted unit manipulation system according to the present disclosure will be described in more detail through application examples.

Figure 17:
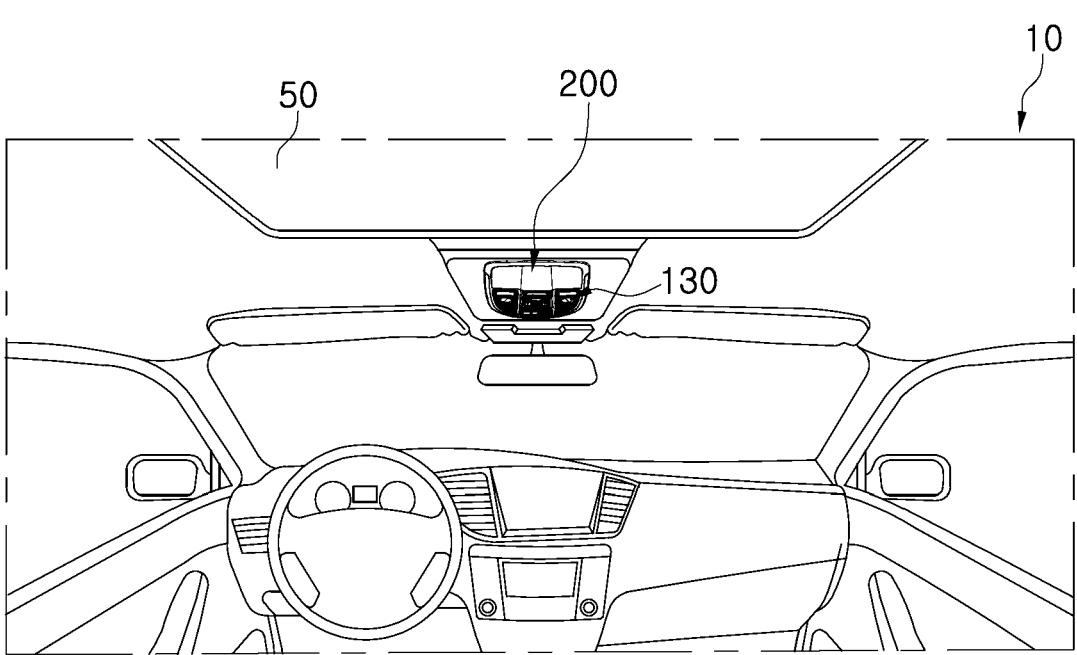
FIG. 17 is a view illustrating an example in which the vehicle-mounted unit manipulation system according to the present disclosure is installed in a vehicle.

FIG. 17 is a view illustrating an example in which the vehicle-mounted unit manipulation system according to the present disclosure is installed in a vehicle.

The motion gesture sensing device 200 may be installed on an overhead console inside of a vehicle 10. Of course, the motion gesture sensing device 200 may be installed at another location of the vehicle 10 in consideration of the occupant's operational convenience and the arrangement location of the vehicle-mounted unit.

The motion gesture sensing device 200 may recognize the occupant's motion gesture and operate various lamps 131 disposed on the overhead console or a sunroof 50 accordingly.

As an example, as described above, the motion gesture sensing device 200 may form a sensing space with an electric field and may instruct a lamp controller (not shown) to operate a corresponding lamp in response to the occupant' motion gesture, and accordingly, the lamp controller can activate the corresponding lamp.

As another example, the motion gesture sensing device 200 may form a sensing space with an electric field, and may instruct a sunroof controller (not shown) to operate a sunroof window in response to the occupant's motion gesture, and accordingly, the sunroof controller can activate the sunroof.

As a specific example of operating the vehicle-mounted unit according to the occupant's motion gesture, FIGS. 18A to 20B illustrate various embodiments of performing a lighting operation function according to the occupant's motion gesture through the vehicle-mounted unit manipulation system according to the present disclosure.

Figure 18A:
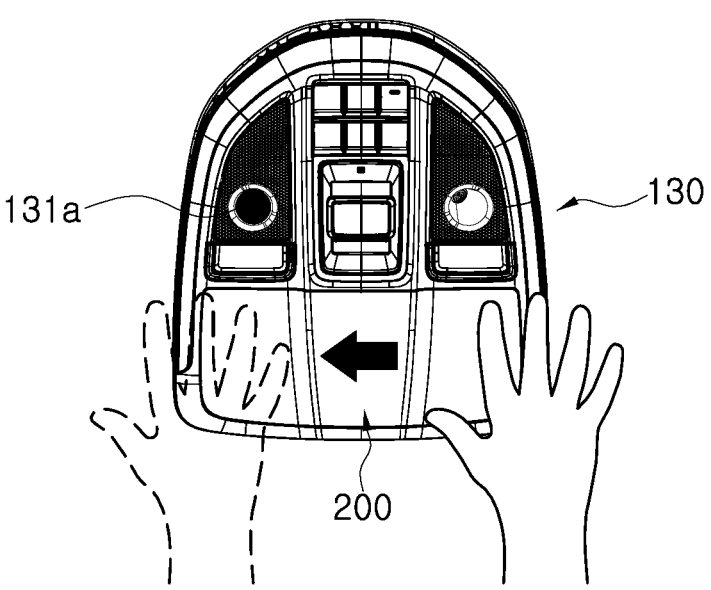
FIGS. 18A to 20B are views illustrating various embodiments of performing a lighting operation function according to an occupant's motion gesture using the vehicle-mounted unit manipulation system according to the present disclosure.
Figure 18B:
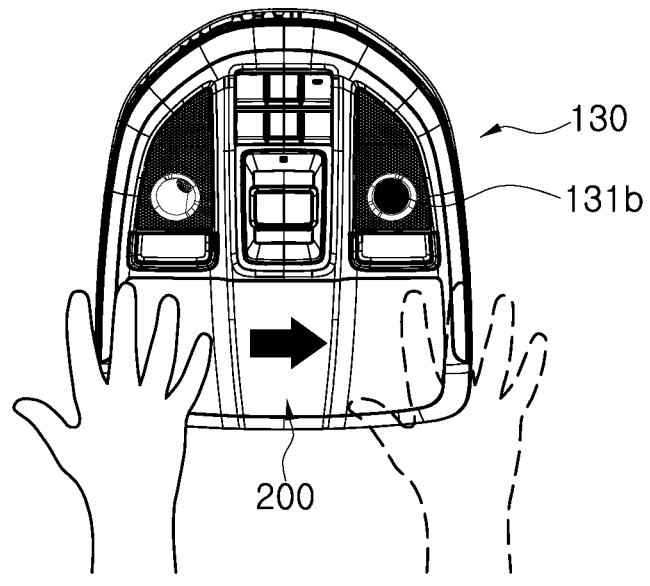

As illustrated in FIGS. 18A and 18B, when a sweep motion in the left or right direction is recognized in the sensing space of the motion gesture sensing device 200 disposed on the vehicle overhead console, the right or left lamp can be operated accordingly.

When an occupant's sweep motion is generated from the left to the right as illustrated in FIG. 18A, the motion gesture sensing device 200 may detect a change in the electric field in the sensing space according to the sweep motion, and turn on a left map lamp 131*a* accordingly.

In addition, when an occupant's sweep motion is generated from the right to the left as illustrated in FIG. 18B, the motion gesture sensing device 200 may detect a change in the electric field in the sensing space according to the sweep motion, and turn on a right map lamp 131*b* accordingly.

Figure 19A:
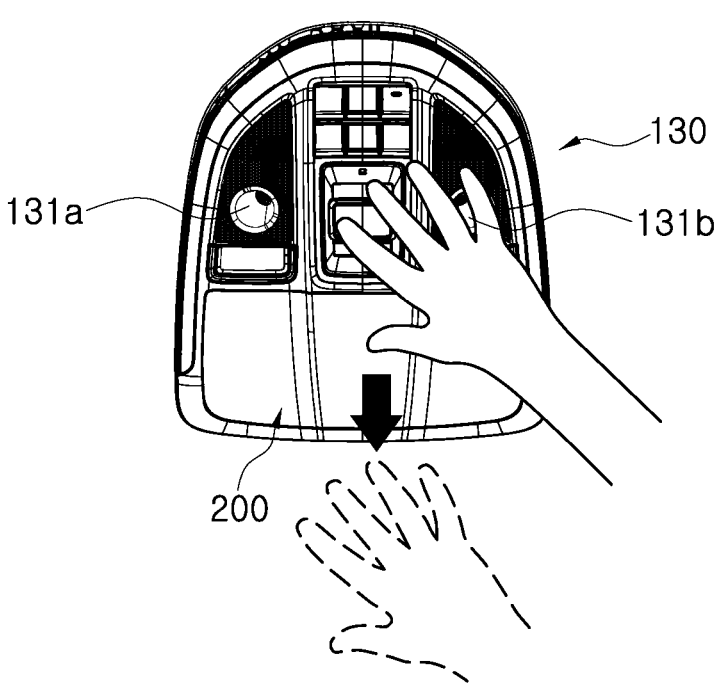
Figure 19B:
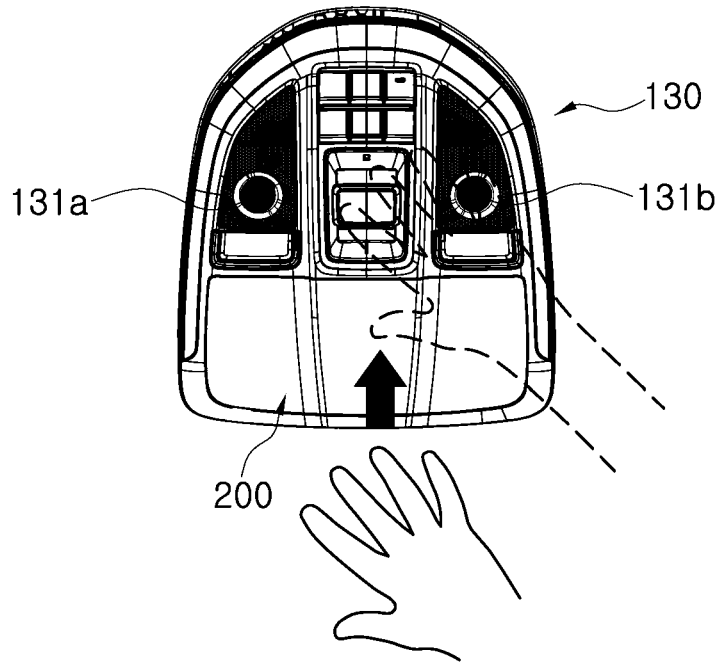

As illustrated in FIGS. 19A and 19B, when a vertical sweep motion is recognized in the sensing space of the motion gesture sensing device 200 disposed on the vehicle overhead console, room lamps can be operated accordingly.

When an occupant's sweep motion is generated from the upper side to the lower side as illustrated in FIG. 19A, the motion gesture sensing device 200 may detect a change in the electric field in the sensing space according to the sweep motion, and turn off room lamps 131*a*, 131*b* accordingly.

When an occupant's sweep motion is generated from the lower side to the upper side as illustrated in FIG. 19B, the motion gesture sensing device 200 may detect a change in the electric field in the sensing space according to the sweep motion, and turn on room lamps 131*a*, 131*b* accordingly.

Figure 20A:
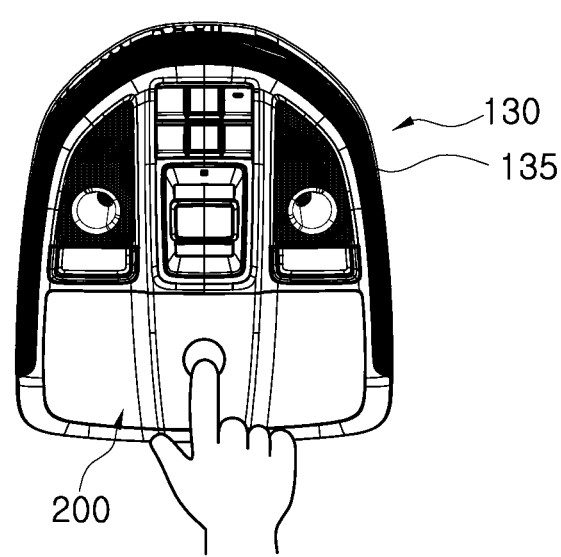

Furthermore, when the electric field intensifying member 210 described above is applied, an electrode pad of the sensing board 230 may recognize an occupant's finger touch to the cover 110. Upon the occupant's finger touch to the cover of the motion gesture sensing device 200 as illustrated in FIG. 20A, the electrode pad of the sensing board may detect this touch action and turn on a mood lamp 130 in response to the touch action.

In addition, upon the occupant's finger touch to the cover of the motion gesture sensing device 200 in a repeated manner at regular intervals, the electrode pad of the sensing board may detect this touch action and change the intensity and color of the mood lamp 135 in response to the touch action.

Figure 20B:
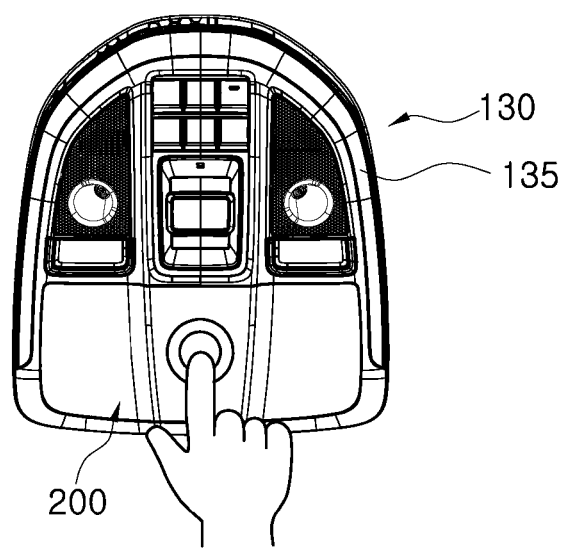

In addition, upon the occupant's finger touch to the cover of the motion gesture sensing device 200 in a continuous double touching manner as illustrated in FIG. 20B, the electrode pad of the sensing board may detect this touch action and turn off the mood lamp 130 in response to the touch action.

According to the present disclosure as described above, the sensing space is formed with an electric field so that a change in the electric field according to a motion gesture of an occupant in the sensing space is recognized to operate a function of respective vehicle-mounted unit.

Various vehicle-mounted units can be integrally manipulated through the occupant's motion gesture using the vehicle-mounted unit manipulation system to which the motion gesture sensing device is applied.

The above description is merely illustrative of the technical spirit of the present invention, and it will be apparent to those skilled in the art to which the present invention pertains that various modifications and variations can be made without departing from the essential characteristics of the present invention. Therefore, the embodiments described in the present disclosure are not intended to limit the technical spirit of the present invention, but to describe the same, and the technical spirit of the present invention is not limited by these embodiments. The protection scope of the present invention should be construed by the following claims, and all technical ideas within the scope equivalent thereto should be construed as being included in the scope and spirit of the present invention as disclosed in the accompanying claims.

What is claimed is:

1. A motion gesture sensing device comprising:
a sensing board including an electrode pattern forming a sensing space with an electric field on a front side of the electrode pattern and detecting a change in the electric field in response to a motion of a user in the sensing space;
a gesture determination board determining a gesture of the user on the basis of the change in the electric field detected in the sensing space; and
a main board supporting an execution of a specific function of a unit corresponding to the determined gesture,
wherein the electrode pattern comprises:
a transmitter electrode disposed in a central region of the sensing board and forming the sensing space; and
receiver electrodes disposed along upper, lower, left, and right outer edges of the sensing board and detecting the change in the electric field,
wherein the transmitter electrode comprises four elongated sub-transmitter electrodes arranged in a rectangular central region of the sensing board, the four elongated sub-transmitter electrodes extending in parallel with each other, and disposed at equal distances from upper and lower receiver electrodes,
wherein a first pair of the four elongated sub-transmitter electrodes located in outer portions of the rectangular central region with respect to left and right receiver electrodes are disposed closer to the left and right receiver electrodes than a second pair of the four elongated sub-transmitter electrodes located in a central portion of the rectangular central region,
wherein the first pair of the four elongated sub-transmitter electrodes located in the outer portions have a stronger output than the second pair of the four elongated sub-transmitter electrodes located in the central portion.

2. The motion gesture sensing device according to claim 1, further comprising a cover disposed on the front side of the sensing board to cover the electrode pattern.

3. The motion gesture sensing device according to claim 2, wherein the cover has a curved shape, and a gap space is formed between a lower surface of the cover and the electrode pattern.

4. The motion gesture sensing device according to claim 3, further comprising one or more electric field intensifying member disposed in the gap space such that a lower end thereof is in contact with the electrode pattern and an upper end thereof is in contact with the lower surface of the cover, the one or more electric field intensifying member comprising a conductive material electrically connected to the electrode pattern.

5. The motion gesture sensing device according to claim 4, wherein the one or more electric field intensifying member has an elastic force so that the one or more electric field intensifying member is deformed correspondingly to the curved shape of the cover.

6. The motion gesture sensing device according to claim 4, wherein a plurality of the electric field intensifying members are distributed and disposed in the gap space.

7. The motion gesture sensing device according to claim 4, wherein the one or more electric field intensifying member is configured to recognize a user's touch to the cover.

8. The motion gesture sensing device according to claim 4, wherein the one or more electric field intensifying member comprises a sponge or rubber block containing an electrically conductive material and having an elastic force.

9. The motion gesture sensing device according to claim 4, wherein the one or more electric field intensifying member comprises a coil spring formed of a conductive material and having one side contacting the electrode pattern and the other side contacting the lower surface of the cover.

10. The motion gesture sensing device according to claim 4, wherein the one or more electric field intensifying member comprises a leaf spring formed of a conductive material and having a pressure-deformable elastic part with an upper portion contacting the lower surface of the cover and support legs contacting the electrode pattern, the support legs being connected to both sides of the elastic part.

11. A vehicle manipulation system comprising:
the motion gesture sensing device according to claim 1; and
one or more vehicle-mounted units operated according to a command provided from the main board of the motion gesture sensing device.

12. The vehicle manipulation system according to claim 11, wherein the motion gesture sensing device is disposed on an overhead console of a vehicle, determines the gesture of an occupant based on the motion of the occupant in a space in front of the overhead console, and operates the one or more vehicle-mounted units corresponding to the gesture of the occupant.

13. The vehicle manipulation system according to claim 12, wherein the motion gesture sensing device is configured to recognize the motion of the occupant, determine the gesture of the occupant according to the motion of the occupant, and transmit the command to perform the specific function of a particular vehicle-mounted unit among the one or more vehicle-mounted units according to the gesture of the occupant.

14. The vehicle manipulation system according to claim 11, wherein the one or more vehicle-mounted units comprise a lighting unit comprising:
a plurality of lamps emitting light; and
a lamp controller configured to control an operation of respective lamps according to the command provided from the main board.

15. The vehicle manipulation system according to claim 11, wherein the one or more vehicle-mounted units comprise a sunroof unit comprising:
a sunroof window mounted on a vehicle ceiling to open and close; and
a controller configured to control an operation of the sunroof window according to the command provided from the main board.

* * * * *